United States Patent [19]
Dobos et al.

[11] Patent Number: 5,225,776
[45] Date of Patent: Jul. 6, 1993

[54] METHOD AND APPARATUS FOR PROBING AND SAMPLING AN ELECTRICAL SIGNAL

[75] Inventors: Laszlo J. Dobos, Beaverton; Arthur J. Metz, Gervais, both of Oreg.

[73] Assignee: Tektronix, Inc., Wilsonville, Oreg.

[21] Appl. No.: 773,057

[22] Filed: Oct. 7, 1991

[51] Int. Cl.⁵ .......................................... G01R 13/20
[52] U.S. Cl. ............................ 324/121 R; 324/158 P; 328/151
[58] Field of Search ........... 324/121 R, 158 R, 158 P, 324/72.5; 328/151; 307/351, 352; 315/364; 364/487, 481

[56] References Cited
U.S. PATENT DOCUMENTS

| | | | |
|---|---|---|---|
| 3,593,163 | 7/1971 | Quet et al. | 328/151 |
| 3,629,731 | 12/1971 | Frye | 333/7 |
| 3,704,416 | 11/1972 | Elliott et al. | 328/151 |
| 3,812,386 | 5/1974 | Porter | 328/151 |
| 3,864,638 | 2/1975 | Audenard et al. | 328/151 |
| 4,069,447 | 1/1978 | Frye | 320/1 |
| 4,495,586 | 1/1985 | Andrews | 364/487 |
| 4,814,714 | 3/1989 | Beadle | 307/352 |

Primary Examiner—Vinh Nguyen
Attorney, Agent, or Firm—Richard B. Preiss; Francis I. Gray

[57] ABSTRACT

A signal acquisition and sampling system mounted in an oscilloscope probe includes an input buffer amplifier (30) featuring shunt feedback, offset capability, input bias current compensation, and very low input capacitance. Signal sampling is accomplished by a cascaded pair of differential sampling bridges including a fast track-and-hold stage (40) followed by a slow track-and-hold stage (50). The differential configuration of the bridges features common mode rejection of strobe signal coupling into the signal path and reduces aberrations and voltage droop. The fast track-and-hold stage features Schottky diode switching bridges (42A) and (42B), low value storage capacitors (44A) and (44B), thereby resulting in a fast tracking time. The slow track-and-hold stage features low-leakage diode-connected transistor switching bridges (52A) and (52B) and a FET buffer stage, thereby resulting in fast acquisition of the fast stage output and long hold time for quantization of the sample. A strobe signal is coupled through a cable (72) to a timing generator (80) on integrated circuit (20). The strobe signal causes the fast track-and-hold stage to briefly hold samples of the input signal while simultaneously causing the timing generator to drive the slow track-and-hold stage to quickly acquire the output of the fast stage and hold the acquired value for extended time intervals. The bandwidth of the fast stage is thereby combined with the stability of the slow stage.

19 Claims, 8 Drawing Sheets

UNITY GAIN BUFFER

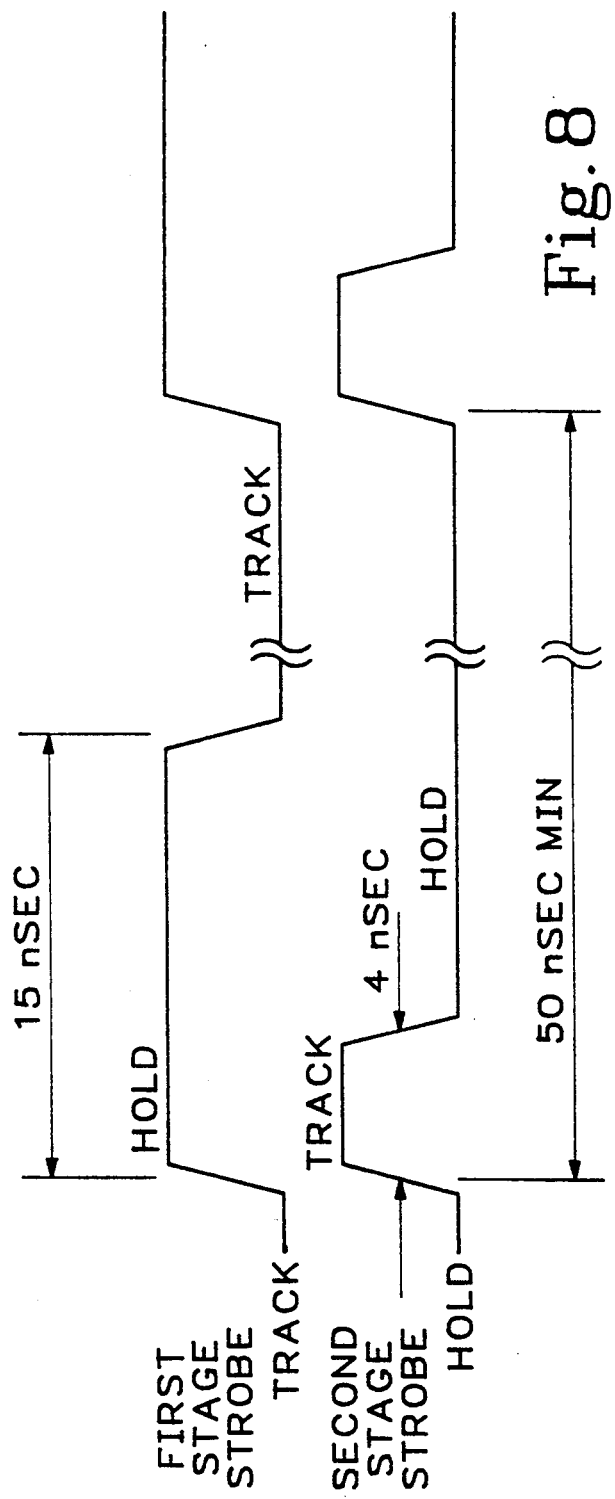

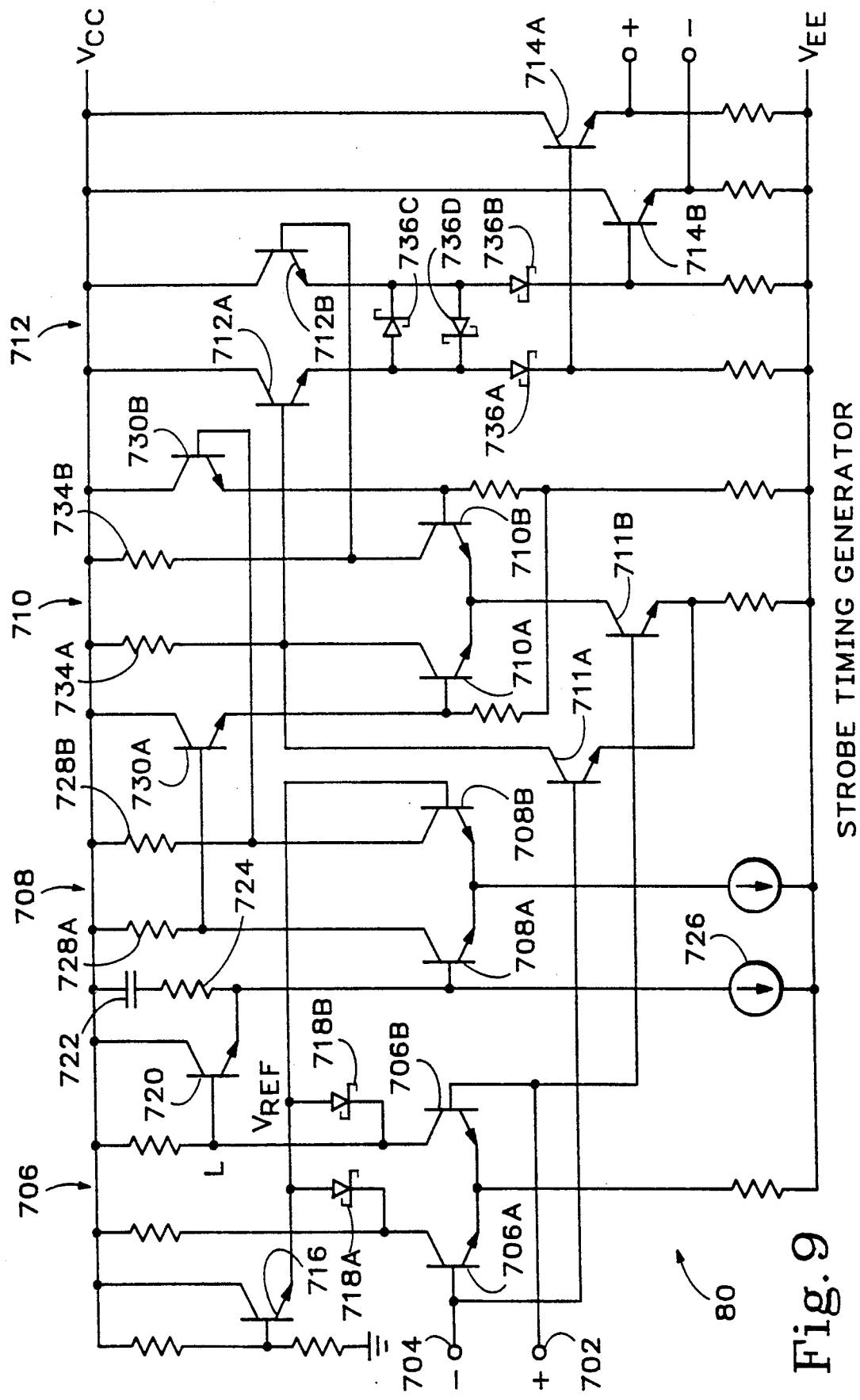
Fig. 9 STROBE TIMING GENERATOR

METHOD AND APPARATUS FOR PROBING AND SAMPLING AN ELECTRICAL SIGNAL

TECHNICAL FIELD

This invention relates to the acquisition of electrical signals and more particularly to apparatus and methods for performing electrical signal conditioning and signal sampling by an oscilloscope probe.

BACKGROUND OF THE INVENTION

Referring to FIG. 1, a conventional digital oscilloscope 10 displays a digitally reconstructed waveform 12 representing an input electrical signal that has been acquired from a unit under test 14 by means of a probe 16 interconnected to digital oscilloscope 10 by a cable 18. In operation, digital oscilloscope 10 acquires samples of the input signal at uniformly spaced time intervals and by means of an analog-to-digital converter converts the samples to quantized samples. The quantized samples are stored in a waveform memory until they are retrieved to render reconstructed waveform 12.

U.S. Pat. No. 4,495,586 of Andrews, assigned to the assignee of the present application, describes a digital oscilloscope that can acquire and display high-frequency electrical signals by storing a plurality of quantized signal samples in a waveform memory. The waveform memory is subsequently "read out" and displayed. The digital oscilloscope of Andrews acquires plural samples of the input signal for each repetition of the input signal, develops quantized values of the samples, and stores the quantized values in predetermined waveform memory address locations. A time interval measurement unit and a presettable counter serve to determine the correct waveform memory address locations corresponding to the time at which each signal sample was quantized. This operation is repeated for each repetition of the input electrical signal and is known as equivalent time sampling. In the digital oscilloscope of Andrews, the input signals are remotely probed and conducted to the oscilloscope by a cable. The input signals are amplified, sampled, and quantized by circuits located inside the mainframe of the oscilloscope.

Designers of digital oscilloscopes 10 have long sought to improve the displayed fidelity of waveforms 12 reconstructed from samples of very-high frequency input signals. The fidelity of the reconstructed waveform is a function of the speed and accuracy of the various circuits used to sample and quantize the acquired signal. High-frequency signals contain edges having a fast rate of voltage change per unit of time. Samples of such a signal must be acquired during a correspondingly narrow sample time in order to accurately capture the voltage of the signal at predetermined instants in time. The samples must then be stored at a stable value until quantization of each sample is completed. The accuracy and stability of signal sampling is dependent upon the time duration of the samples.

There have been previously known apparatus and methods for separately mounting buffer amplifiers and signal samplers in probes that are connected by a cable to a measurement instrument such as an oscilloscope. Tektronix, Inc. of Beaverton, Oreg., assignee of the present application, started manufacturing low-capacitance active probes in the 1960s as an accessory for the Model 585 oscilloscope. More recently, FET buffer probes have been available from various manufacturers including Tektronix, Inc. However, such probes usually require relatively high operating voltages if they are to accurately acquire signals having large amplitudes or DC components.

Other prior art signal sampling probes, such as the Model S-3 manufactured by the assignee of the present application, provide 1 gigahertz sampling bandwidth with only two picofarads of input capacitance. However, such sampling probes have required that a sampling strobe signal, generated by the oscilloscope, be transmitted to the sampling head by differentially driven coaxial cables. The presence of the sampling strobe signal can cause injection of undesired signals into the signal source and can produce aberrations on the sampled signal. When flexed or otherwise moved, the cables for remote sampling heads caused sampling delay variations as well as DC offset changes. Remote sampling head systems are also sensitive to burnout, and are relatively expensive to service and manufacture.

SUMMARY OF THE INVENTION

An object of this invention is, therefore to provide a remote signal acquisition probe having an accurate and stable high-speed signal sampling capability operable with input electrical signals having a wide range of voltage, frequency, and impedance parameters.

Another object of this invention is to provide a remote signal acquisition probe having very wide bandwidth, very low input capacitance, minimum susceptibility to burnout, low aberrations, and minimum signal injection into the signal source.

A further object of this invention is to provide a remote signal acquisition probe requiring low operating voltages and having insensitivity to cable motion.

The present invention uses electrical circuitry mounted in a probe to form a signal acquisition probe system. An input buffer amplifier features shunt feedback, which enables operation from low power supply voltages, a remote offset capability (for bucking out large DC components present in the input signal), nearly constant operating point conditions, bias current compensation, and very low input capacitance (for high bandwidth coupled with resistance to burnout-producing transient voltages).

A cascaded pair of differential sampling bridges form a fast track-and-hold stage followed by a slow track-and-hold stage. The differential configuration of the bridges features common mode rejection of strobe signal coupling into the signal path and reduces aberrations common to prior art sampling bridges. The differential configuration also cancels voltage step and voltage droop distortions common to sampling circuits. The fast track-and-hold stage features Schottky diode switching bridges and low value storage capacitors for fast tracking to achieve high sampling bandwidth. The slow track-and-hold stage features low-leakage diode-connected transistor switching bridges, a FET buffer stage, and larger value storage capacitors to achieve a short acquisition time to acquire the fast stage output while allowing time for quantization of the signal sample. The outputs of the fast and slow stages drive a pair of differential unity gain buffer amplifiers. The slow stage buffer amplifier provides a low-impedance single-ended output signal suitable for driving a cable in a manner that reduces sensitivity to cable motion.

The oscilloscope provides a strobe signal through the cable to a timing generator. The strobe signal causes the fast track-and-hold stage to briefly sample the input signal while simultaneously causing the timing generator to generate a second strobe signal. The second strobe signal causes the slow track-and-hold stage to quickly acquire the output of the first stage and to hold the acquired value for an extended time interval. The bandwidth of the fast stage combined with the accuracy of the slow stage supports accurate low-aberration signal sampling of high-frequency signals.

Additional objects and advantages of this invention will be apparent from the following detailed description of a preferred embodiment thereof which proceeds with reference to the accompanying drawings.

BRIEF DESCRIPTION OF THE DRAWINGS

FIG. 8 is a waveform timing diagram representing the relationship existing between sample timing signals governing the operation of the invention.

FIG. 9 is a simplified electrical circuit diagram of the strobe timing generator according to this invention.

DETAILED DESCRIPTION OF PREFERRED EMBODIMENT

Figure 1:
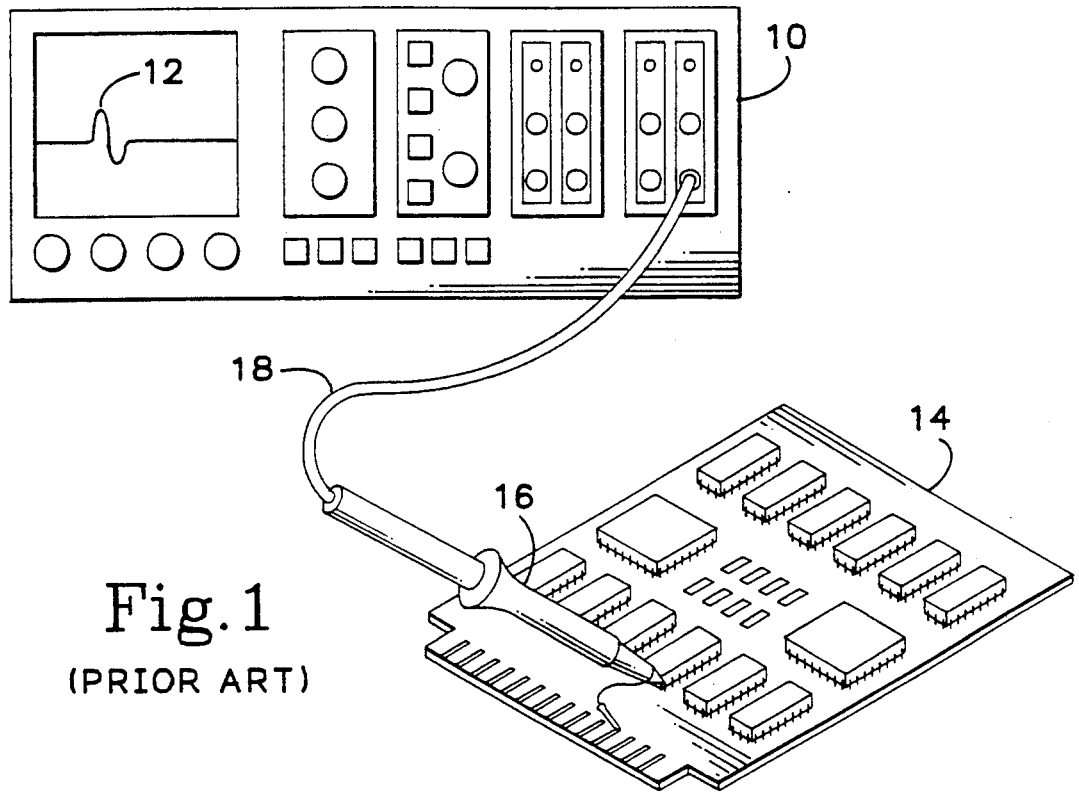
FIG. 1 is a system-level pictorial diagram of a prior art sampling oscilloscope and unit under test.
Figure 2A:
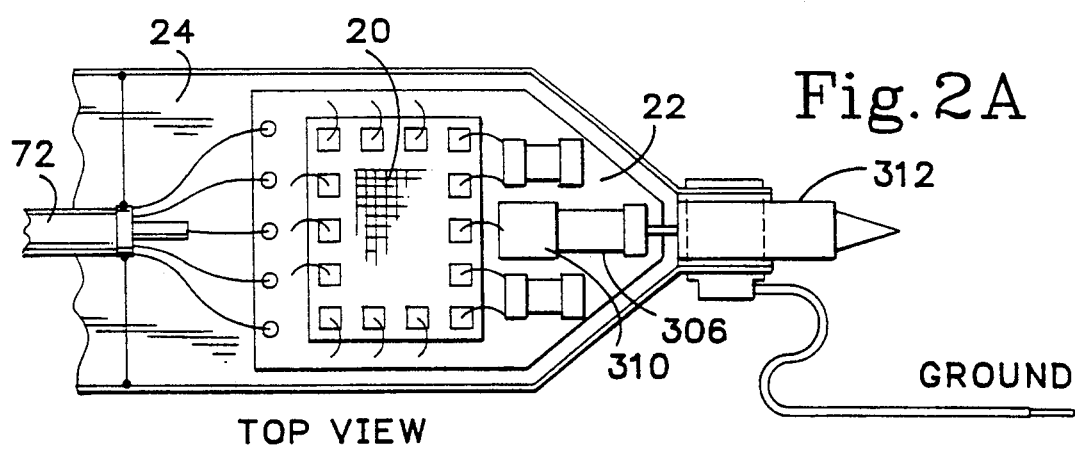
FIG. 2A is an enlarged cutaway pictorial diagram showing a top view of the integrated circuit and hybrid circuit mounted in a probe tip in a manner according to this invention.
Figure 3:
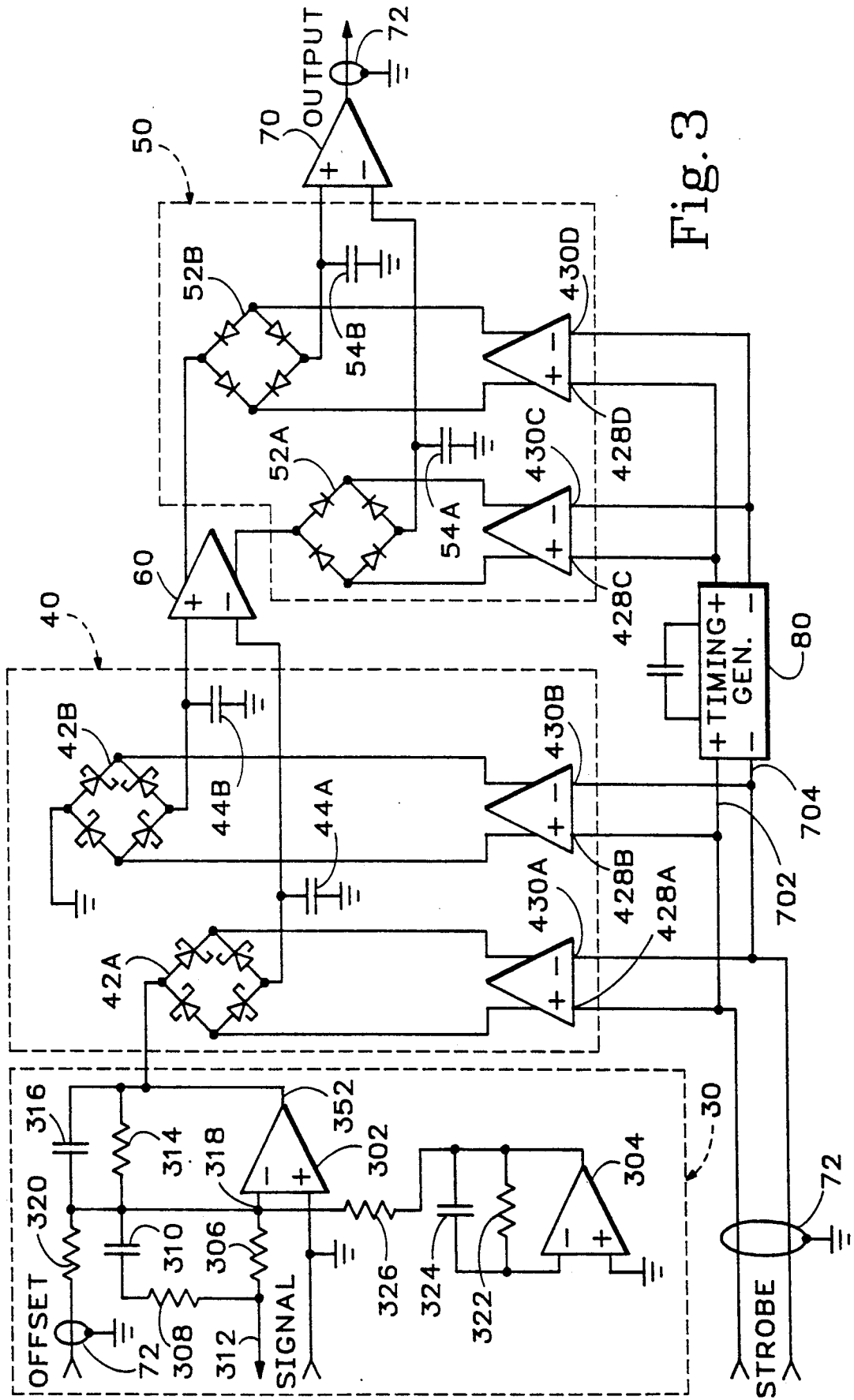
FIG. 3 is a simplified electrical circuit diagram of the signal acquisition probe according to this invention.

Referring to FIG. 2A, this invention utilizes an application-specific analog integrated circuit 20 and a thick-film hybrid circuit 22 mounted in a probe 24 to implement a signal acquisition probe system, the simplified overall electrical block diagram for which is illustrated in FIG. 3.

Referring to FIG. 3, an input buffer amplifier 30 features shunt feedback, which enables operation from low power supply voltages, a remote offset capability (for bucking out large DC components present in the input signal), nearly constant operating point conditions, bias current compensation, and very low input capacitance (for high bandwidth coupled with resistance to burnout producing transient voltages).

A cascaded pair of differential sampling bridges form a combination of a fast track-and-hold stage 40 followed by a slow track-and-hold stage 50. Fast track-and-hold stage 40 utilizes Schottky diode switching bridges 42A and 42B, low value storage capacitors 44A and 44B, for fast tracking time. Slow track-and-hold stage 50 utilizes low-leakage diode-connected transistor switching bridges 52A and 52B, a FET buffer stage (described later), and larger value storage capacitors 54A and 54B, for an acquisition time sufficient to acquire and quantize the output of fast stage 40. The outputs of fast stage 40 and slow stage 50 drive respective differential unity gain buffer amplifiers 60 and 70. Buffer amplifier 70 provides a low-impedance single-ended output signal suitable for driving a coaxial cable 72.

The oscilloscope provides a first stage strobe signal coupled through cable 72 to a timing generator 80. The first stage strobe signal simultaneously causes fast track-and-hold stage 40 to sample the input signal and timing generator 80 to generate a second strobe signal, thereby causing slow track-and-hold stage 50 to quickly acquire the output of first stage 40 and to hold the acquired signal value for an extended time interval. In this manner the bandwidth of fast stage 40 can be combined with the accuracy of slow stage 50.

Figure 2B:
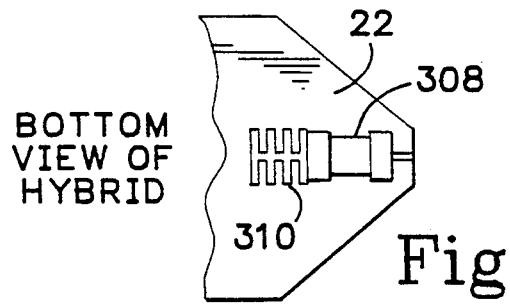
FIG. 2B is an enlarged fragmentary bottom view of the tip portion of the hybrid circuit of FIG. 2A.

Referring to FIGS. 2A, 2B, and 3, input buffer amplifier 30 comprises a signal amplifier 302 and bias compensation amplifier 304 formed on integrated circuit 20 which is fabricated from an application-specific analog circuit process such as QUIKCHIP (tm) available from the assignee of the present application. Depending on the performance required, integrated circuit 20 can also be implemented from full- and semi-custom analog integrated circuit processes available from a variety of manufacturers. Alternatively, the present invention could also be implemented with discrete components if the resulting performance and form factor met user requirements.

Signal amplifier 302 includes an input network comprising a 100 Kohm input resistor 306, a damping resistor 308, and an input peaking capacitor 310. FIGS. 2A and 2B show the preferred topology for the construction of the input network. Input resistor 306 is formed on the top surface of hybrid circuit 22 and has one end very close to a probe tip 312. The other end of input resistor 306 forms one plate of peaking capacitor 310. Damping resistor 308 and the other plate of peaking capacitor 310 are formed on the bottom side of hybrid circuit 22 with the plate of peaking capacitor 310 being physically aligned with the plate on the top surface of hybrid circuit 22. Input resistor 306 and damping resistor 308 are laser trimmed to the correct values by well known means. Peaking capacitor 310 is trimmed by removing portions of fingers forming the bottom plate of capacitor 310 (FIG. 2B).

Signal amplifier 302 also includes a feedback network comprising a 10 Kohm feedback resistor 314 and a feedback capacitor 316. The input network components and feedback network components merge at a summing junction 318 of signal amplifier 302 forming a shunt feedback configuration. Summing junction 318 is at virtual ground and has a very low parasitic capacitance. The resulting probe input capacitance of signal amplifier 302 is about 0.25 picofarads. In the preferred embodiment the feedback networks provide signal amplifier 302 with a 10:1 signal attenuation ratio.

Cable 72 also carries an offset voltage supplied from an external source such as digital oscilloscope 10. The offset voltage is applied to summing junction 318 through an offset resistor 320. The offset voltage is manually adjusted by the operator of digital oscilloscope 10 to compensate for any DC component on the electrical input signal. The signal attenuation and offset functions provided by signal amplifier 302 are referred to as "signal conditioning."

Referring again to FIG. 3, bias compensation amplifier 304 is designed to have its input stage thermally and geometrically matched to the input stage of signal amplifier 302. Bias compensation amplifier 304 has a feedback network consisting of a feedback resistor 322 having a value of 10 Kohms matched to the value of feedback resistor 314 of signal amplifier 302 and a bypass capacitor 324 having a value sufficiently large to stabilize bias compensation amplifier 304. The output of bias compensation amplifier 304 is coupled to summing junction 318 of signal amplifier 302 by a compensation resistor 326 having a value matched to the value of feedback resistor 314. Bias compensation amplifier 304 cancels DC voltage shifts that are normally caused by the bias current normally ejected from signal amplifier 302 into summing junction 318.

Figure 4:
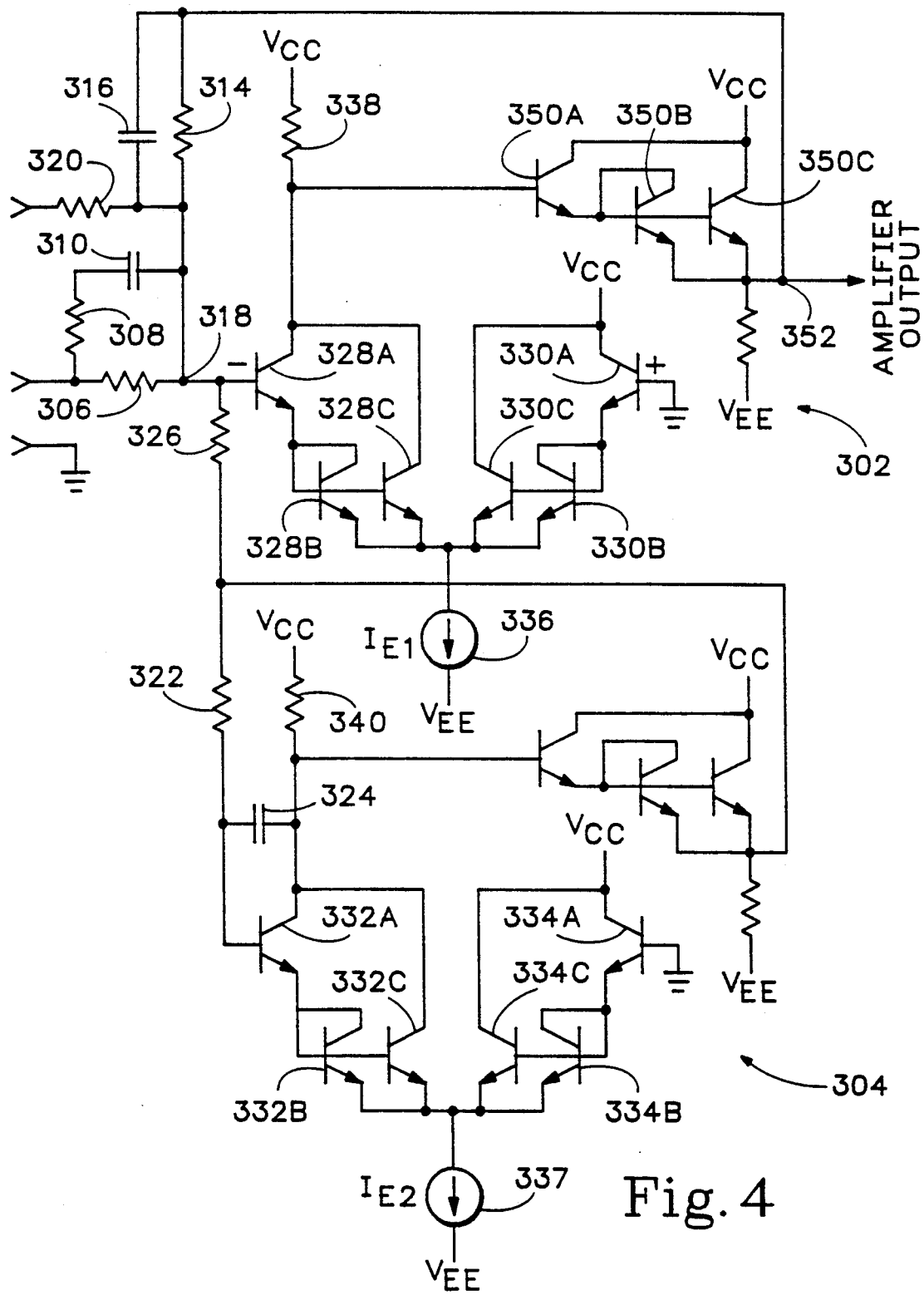
FIG. 4 is an electrical circuit diagram showing a bias compensated offsettable buffer amplifier according to one embodiment of this invention.

FIG. 4 further illustrates circuit details of signal amplifier 302 and bias compensation amplifier 304. The differential input stage of signal amplifier 302 is formed by a pair of compound bipolar transistors 328A, 328B, and 328C and 330A, 330B, and 330C (collectively "transistors 328" and "transistors 330"). Similarly, bias compensation amplifier 304 has a differential input stage formed by a similar pair of compound bipolar transistors 332A, 332B, and 332C and 334A, 334B, and 334C (collectively "transistors 332" and "transistors 334"). The compound configuration of transistors 328, 330, 332, and 334 multiplies the effective beta over that of a single transistor. This circuit also increases the amplifier bandwidth at the expense of some open loop gain. Because the open loop gain is relatively low, current sources 336 and 337 are designed to accurately track the current required through respective load resistors 338 and 340. Therefore, the current generated by current source 336 should track the voltage $V_{CC}-V_{BE}350A-V_{BE}350B$.

Figure 5A:
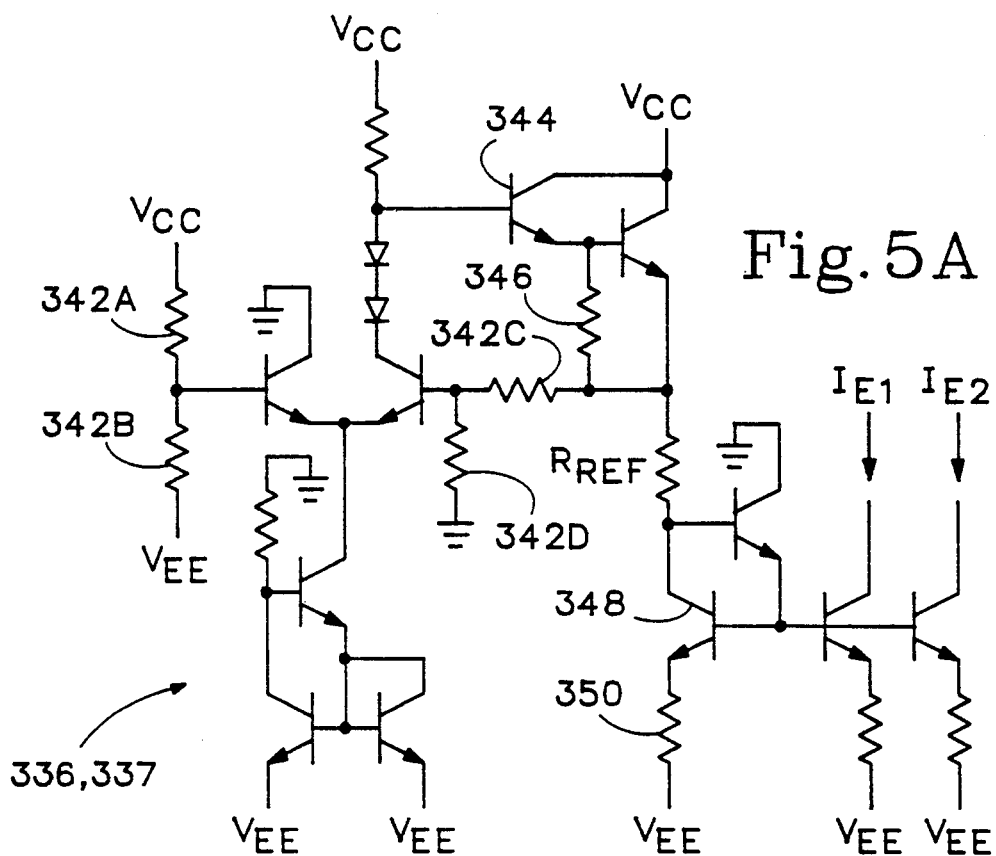
FIGS. 5A and 5B are electrical circuit diagrams showing, respectively, an NPN transistor embodiment and a PNP and NPN transistor embodiment of a tracking current source for use with the buffer amplifier of FIG. 4.

FIG. 5A shows an all NPN implementation of tracking current sources 336 and 337. Resistors 342A, 342B, 342C, and 342D have substantially equal values. Feedback forces the voltage between the emitter of a transistor 344 and voltage source $V_{EE}$ to track voltage source $V_{CC}$ accurately. Thus, the voltage impressed across a network formed by a current reference resistor $R_{REF}$, a transistor 348, and a resistor 350 is equal to $V_{CC}-0$. Therefore, the voltage across $R_{REF}$+the voltage across $R_{350}$ is equal to $V_{CC}-2V_{BE}$ as required.

Figure 5B:
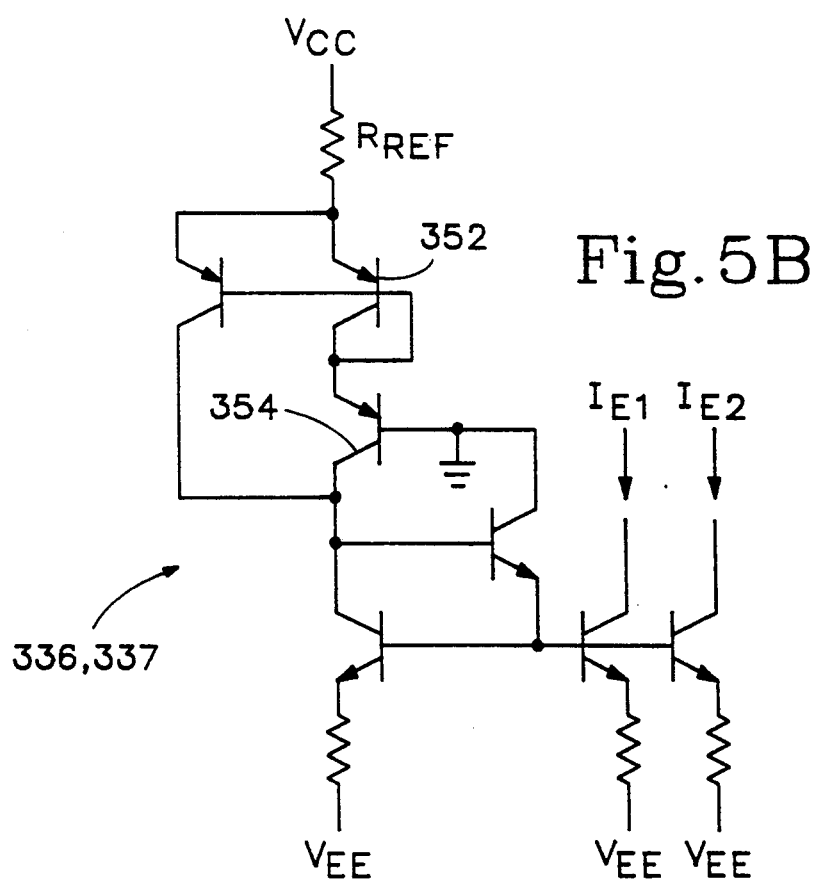

FIG. 5B shows a simpler PNP version of tracking current sources 336 and 337 that is usable if the beta of the PNP transistors is greater than 10. Voltage source $V_{CC}$ is impressed across a network formed by $R_{REF}$ and a pair of transistors 352 and 354. The voltage across $R_{REF}$ is equal to $V_{CC}-V_{BE}352-V_{BE}354$ and establishes the required reference current.

Returning to FIG. 4, the signal developed across load resistor 338 is coupled to an output stage comprised of transistors 350A, 350B, and 350C, which form a compound bipolar transistor emitter follower. An amplifier output 352 is developed at the emitter of transistor 350C. Amplifier output 352 is single-ended and is referenced to ground. Alternatively, a differential output configuration may be used.

In an alternative embodiment of input buffer amplifier 30, a combination bipolar and FET (referred to as "bi-FET") integrated circuit process may be utilized, resulting in higher input resistance with only a small increase in input capacitance. The bi-FET process further allows the elimination of compensation amplifier 304. The increased input resistance would allow input resistor 306 to be increased in value. Related input and feedback network component values may be scaled accordingly resulting in a probe having very low signal loading characteristics. Either alternative embodiment of input buffer amplifier 30 is operable from power supplies having potentials of less than 24 volts without any hazard or sacrifice of performance. In the preferred embodiment, the circuitry operates from a plus and minus five volt power source.

In FIG. 3, signal amplifier output 352 is connected to the input of switching bridge 42A. The input of switching bridge 42B is connected to ground. The present invention includes four substantially similar switching bridges that are described with reference to FIG. 6A, which is illustratively representative of switching bridges 42A and 42B (collectively "switching bridge 42"). Switching bridge 42 is formed from a set of four Schottky switching diodes 420A, 420B, 420C, and 420D. The input of switching bridge 42 is formed at the junction of diodes 420A and 420B. The output of switching bridge 42 is formed at the junction of diodes 420C and 420D and is connected to storage capacitor 44. Switching bridge 42 is "turned on" when current is caused to flow through diodes 420A, 420B, 420C, and 420D and switching bridge 42 is "turned off" when diodes 420A, 420B, 420C, and 420D are reverse biased, interrupting the current flow through the diodes.

In operation, the control of current flow through switching bridge 42 occurs as follows. Each of a pair of current sources 422A and 422B is separately connected to the emitters of differential switching transistor pairs 424A/424B and 426A/426B respectively. The collectors of one pair of switching transistors are cross coupled to the collectors of the other pair of switching transistors forming a current switch circuit. The base of transistor 424A forms a positive input 428 to the switch circuit, and the base of transistor 426B forms a negative input 430 to the switch circuit. The currents developed by current sources 422A and 422B will be drawn into either a node 432A or a node 432B of the switch circuit under control of signals impressed on positive input 428 and negative input 430. Nodes 432A and 432B are buffered from switching bridge 42 by a pair of cascode connected transistors 434A and 434B. A pair of clamp diodes 436A and 436B limit the degree of reverse bias voltage applied to switching bridge 42. The limited reverse bias reduces stored charge and leakage current in diodes 420A, 420B, 420C, and 420D, thereby resulting in faster switching times and reduced voltage droop.

By way of example, when switching bridge 42 is turned off, current flows from voltage source $V_{CC}$ through a resistor 438B and into the collector of transistor 434B. Current also flows from voltage source $V_{CC}$ through a resistor 438A and through clamp diode 436A because no current is drawn into the collector of transistor 434A when switching bridge 42 is turned off. The voltage at the collector of transistor 434B is clamped at one forward-biased diode voltage drop below the clamp voltage by the conduction of clamp diode 436B. The voltage at the collector of transistor 434A is clamped at one forward-biased diode voltage drop above the clamp voltage by the conduction of clamp diode 436A. The reverse bias voltage across switching bridge 42 is established by the forward-biased diode voltage drop across clamp diodes 436A and 436B when they are conducting. When diodes 420A, 420B, 420C, and 420D are reverse biased, they are prevented from conducting and have a high electrical resistance that effectively disconnects the bridge input from storage capacitor 44.

To turn on switching bridge 42, positive input 428 is driven positive and negative input 430 is driven negative, thereby switching current flow from transistor 434B to transistor 434A by means of the switch circuit described above. In this instance, current flows from voltage source $V_{CC}$ through resistor 438A into the collector of transistor 434A. However, current also flows from voltage source $V_{CC}$ through resistor 438B, through diodes 420A, 420B, 420C, and 420D, and into the collector of transistor 434A causing switching bridge 42 to turn on. When diodes 420A, 420B, 420C, and 420D are conducting, they have a low electrical resistance and effectively connect the bridge input to storage capacitor 44.

In the present invention, switching bridge 42 is used in a fast track-and-hold configuration in which storage capacitor 44 has a preferred value of about 0.2 picofarads, which is formed from stray capacitance and metal conductors present in the output of switching bridge 42. To minimize leakage of charge stored on storage capacitor 44 while also maintaining a high-bandwidth signal path, a high impedance buffer stage is formed from a set of compound connected transistors 430A, 430B, and 430C. The buffer stage develops an output 432 at the emitters of transistors 430B and 430C. The resulting fast track-and-hold stage 40 has very high signal tracking bandwidth but a relatively short hold time before charge leakage from storage capacitor 44 causes significant voltage droop at output 432.

Figures 6A, 6B:
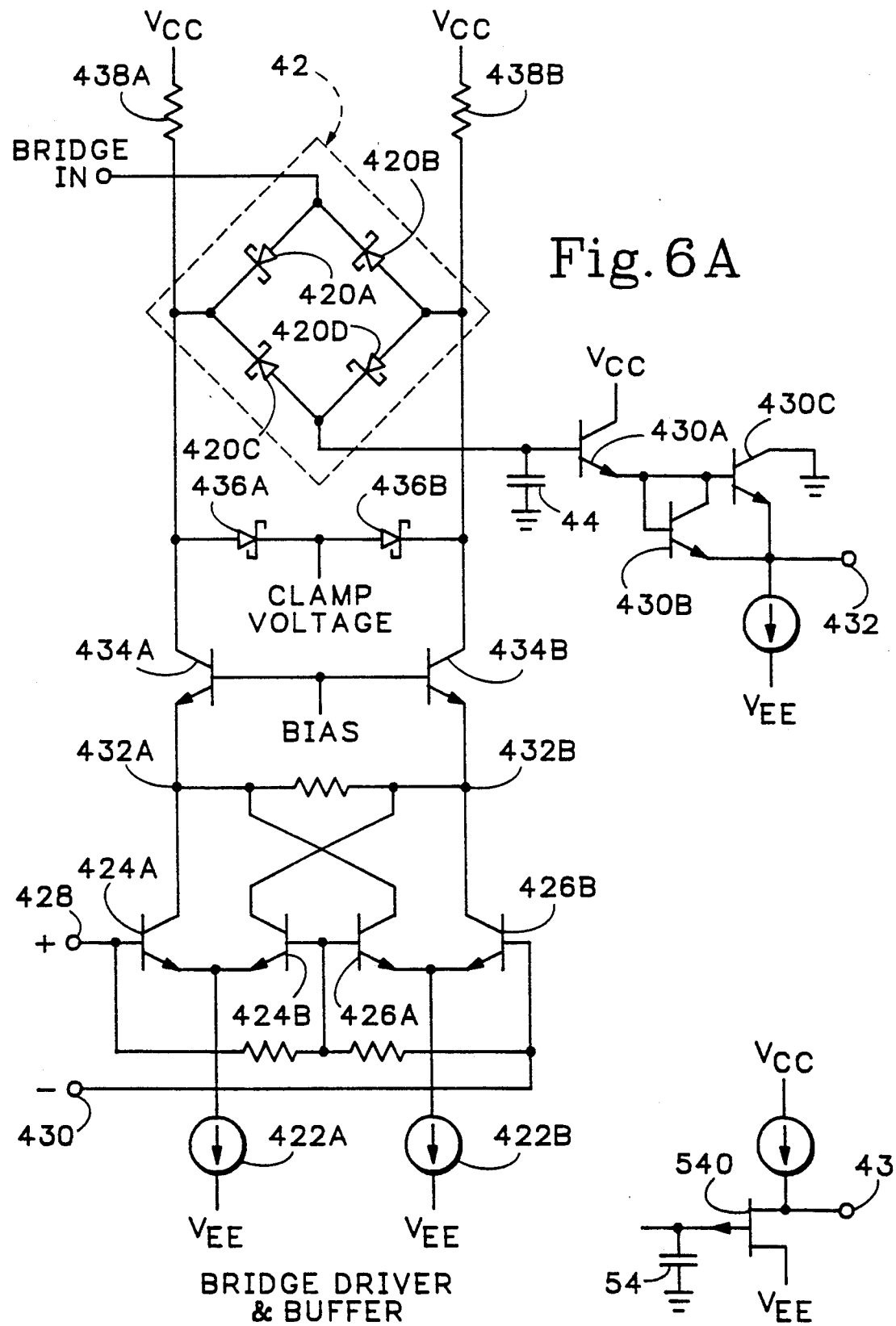
FIG. 6A is a simplified electrical circuit diagram of a sampling bridge, bridge driver, and bipolar transistor buffer circuit according to this invention.
FIG. 6B is a simplified electrical circuit diagram of a FET buffer circuit for use in an alternate embodiment of FIG. 6A.

An alternate configuration of switching bridge 42 is used to form slow track-and-hold stage 50 (FIG. 3). Switching bridges 52A and 52B are formed from diode-connected bipolar transistors having a slower switching speed than Schottky diodes but also having a lower leakage current when turned off. Storage capacitor 44 and transistors 430 are replaced by the circuit of FIG. 6B. Storage capacitors 54A and 54B (FIG. 3) are represented by storage capacitor 54, which has a preferred value of about 1.5 picofarads. To further reduce leakage of charge from storage capacitor 54, the buffer stage formed by transistors 430 of FIG. 6A is replaced by a FET buffer stage 540. The resulting slow track-and-hold stage 50 has moderately fast signal acquisition time coupled with a relatively long hold time before charge leakage from storage capacitor 54 causes significant voltage droop at output 432. Alternative forms of the sampling switches could include FET switches, non-bridge configurations, or other forms depending upon the signal sampling performance required.

FIG. 3 shows the output of fast track-and-hold stage 40 being coupled to the input of slow track-and-hold stage 50 by unity-gain differential buffer amplifier 60. A unity-gain differential buffer amplifier 70 is shown coupling the output of slow track-and-hold stage 50 to cable 72. Buffer amplifiers 60 and 70 have high common-mode rejection ratios, which reduce the effect of switching "steps" that are coupled into storage capacitors 44A and 44B and coupled into storage capacitors 54A and 54B. In like manner, voltage droop common to storage capacitors 44A and 44B and common to storage capacitors 54A and 54B will be cancelled by buffer amplifiers 60 and 70.

Figure 7:
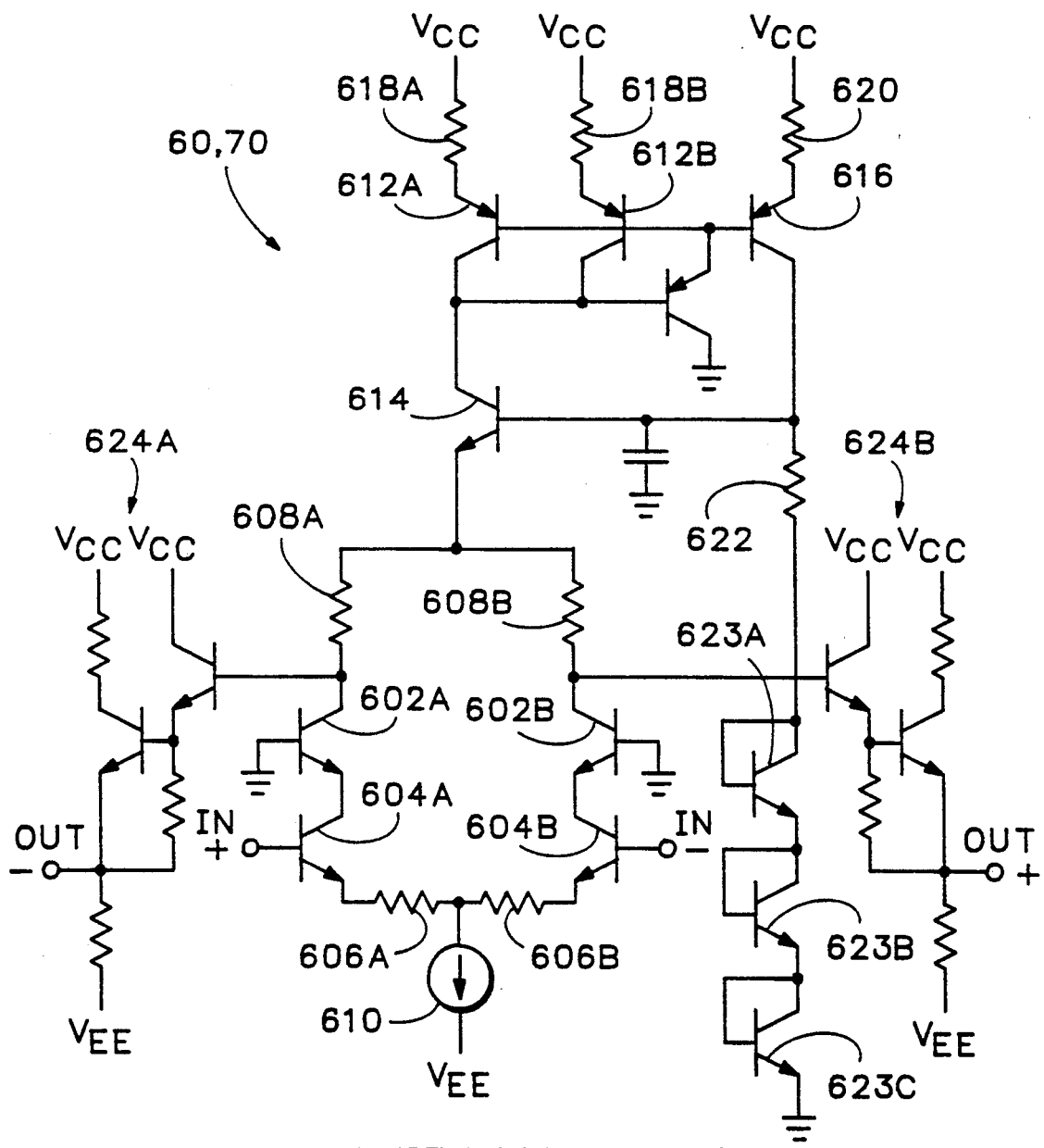
FIG. 7 is a simplified electrical circuit diagram of a unity gain differential buffer amplifier circuit according to this invention.

FIG. 7 shows the preferred circuit configuration of the unity-gain differential buffer amplifier 60. The input stage is formed by a cascode connected differential amplifier including transistors 602A, 602B, 604A, and 604B. Emitter resistors 606A and 606B are matched to load resistors 608A and 608B to produce a balanced unity-gain differential input stage. Emitter current is developed by current source 610. Collector current is generated by a current mirror formed by transistors 612A, 612B, 614, and 616; resistors 618A, 618B, and 620. Bias current is developed across the series combination of a resistor 622 and diode-connected transistors 623A, 623B, and 623C. The buffer amplifier voltages developed across resistors 608A and 608B are buffered by Darlington-connected emitter follower stages 624A and 624B to generate differential output signals. The output signals may be connected differentially as in the case of unity-gain differential buffer amplifier 60.

The signal acquisition and sampling performance of the system shown in FIG. 3 depends on the timing of fast track-and-hold stage 40 and slow track-and-hold stage 50. In operation, cable 72 delivers a fifteen nanosecond strobe signal to bridge driver inputs 428A, 430A, 428B, and 430B; and to a positive input 702 and a negative input 704 of timing generator 80.

Referring to FIGS. 3 and 8, timing generator 80 is triggered by the leading edge of the first stage strobe signal and delivers a four nanosecond second stage strobe signal to bridge driver inputs 428C, 430C, 428D, and 430D. This causes fast track-and-hold stage 40 to hold the signal at signal amplifier output 352 for the duration of the first stage strobe signal. The signal held on storage capacitors 44A and 44B will not droop significantly in fifteen nanoseconds, thereby allowing slow track-and-hold stage 50 to accurately acquire and hold the buffered output of fast track-and-hold stage 40 during the four nanosecond period established by the second stage strobe signal. The buffered output of slow track-and-hold stage 50 will remain stable even for relatively low repetition rates of the strobe signal. The minimum period between repetitions of the strobe signal is about 50 nanoseconds, which minimum period provides a 35 nanosecond settling time for the sampling and switching circuits prior to a subsequent first stage strobe signal. The timing sequence described above supports signal sampling rates of up to 20 megahertz. Other timing periods could have been provided to meet different application requirements.

FIG. 9 shows a preferred circuit embodiment of timing generator 80. An amplifier/switch stage 706 is formed around an emitter-coupled transistor pair 706A and 706B, a comparator stage 708 is formed around an emitter-coupled transistor pair 708A and 708B, a differential logic AND gate 710 is formed around transistors 710A, 710B, 711A, and 711B, and an output stage 712 is formed around transistors 712A, 712B, 714A, and 714B.

Amplifier/switch stage 706 receives the first stage strobe signal on positive input 702 and negative input 704. A reference voltage $V_{REF}$ is generated by transistor 716 and clamps the collectors of transistors 706 to a minimum of one forward-biased diode voltage drop below $V_{REF}$ by means of a pair of clamp diodes 718A and 718B. When the first stage strobe signal is not present, transistor 706A conducts and transistor 706B does not conduct current to thereby cause a transistor 720 to discharge a capacitor 722 through a discharge current limiting resistor 724. When a strobe signal is present, transistor 706A does not conduct current and transistor 706B conducts current to thereby cause transistor 720 to be reverse biased. Capacitor 722 is then allowed to be charged by a current source 726.

Comparator stage 708 senses the difference between $V_{REF}$ and the voltage developed by the accumulation of charge in the form of a negative-going voltage ramp on capacitor 722. Four nanoseconds after it receives the first stage strobe signal, comparator stage 708 senses that the ramp voltage on capacitor 722 is less than $V_{REF}$ and thereby causes transistor 708B to conduct current and transistor 708A to not conduct current. The resulting voltage difference is developed across a pair of load resistors 728A and 728B and is coupled to transistors 710 by a pair of emitter followers 730A and 730B. In this manner, a signal delayed four nanoseconds from the first stage strobe signal is delivered to differential AND gate stage 710.

Differential AND gate stage 710 receives the first stage strobe signal by means of transistors 711A and 711B. The first stage strobe signal and the four nanosecond signal received from emitter followers 730A and 730B are differentially ANDed and developed across a pair of load resistors 734A and 734B. Output stage 712 receives the ANDed signal at transistors 712A and 712B, performs level shifting and clamping by means of diodes 736A, 736B, 736C, and 736D, and generates the second stage strobe signal outputs at the emitters of transistors 714A and 714B.

The invention described above provides a remote signal acquisition probe having an accurate and stable high-speed signal sampling capability operable with input electrical signals having a wide range of voltages and frequencies. The resulting signal acquisition probe has wide bandwidth, very low input capacitance, minimum susceptibility to burnout, low aberrations, and minimum signal injection into the signal source. The probe operates from low operating voltages and is insensitive to cable flexing.

It will be obvious to those having skill in the art that many changes may be made to the details of the above-described embodiments of this invention without departing from the underlying principles thereof. Accordingly, it will be appreciated that this invention is also applicable to signal acquisition applications other than those found in oscilloscopes. The scope of the present invention should be determined, therefore, only by the following claims.

We claim:

1. A method for probing and sampling an electrical signal, comprising the steps of:
   probing the electrical signal;
   conditioning the probed electrical signal;
   receiving a strobe signal from a remote electrically connected device;
   storing an instantaneous value of the conditioned electrical signal during a first time interval responsive to the strobe signal;
   sampling a value of the stored instantaneous value of the conditioned electrical signal during a second time interval responsive to the strobe signal; and
   transmitting the sampled value of the stored instantaneous value of the electrical signal to the remote electrically connected device.

2. The method of claim 1 in which the step of conditioning the probed electrical signal comprises the steps of:
   attenuating the probed electrical signal; and
   offsetting the probed electrical signal in response to an offset signal delivered from a remote electrically connected device.

3. The method of claim 1 in which the storing and sampling steps are accomplished differentially.

4. An apparatus for probing and sampling an electrical signal, comprising:
   probing means for electrically contacting the electrical signal;
   signal conditioning means for altering predetermined parameters of the probed electrical signal and thereby generating a conditioned electrical signal;
   first track-and-hold means for storing a value of the conditioned electrical signal during a first time interval generated in response to a strobe signal;
   timing means responsive to the strobe signal for generating a second time interval;
   second track-and-hold means for sampling the stored value of the conditioned electrical signal from the first track-and-hold means during the second time interval; and
   means for transmitting the sampled value of the electrical signal from the second track-and-hold means through a cable to a remote device.

5. The apparatus of claim 4 in which the predetermined parameters include any of amplitude, offset, or impedance.

6. The apparatus of claim 4 in which the cable further conveys any of the strobe signal, a signal conditioning signal, or a power signal.

7. The apparatus of claim 4 in which the first and the second track-and-hold means comprise differential diode bridge circuits.

8. In a probe connected by a cable to an oscilloscope, an improved apparatus for sampling an electrical signal having a signal source, comprising:
   a cascaded pair of signal sampling circuits, the first sampling circuit having a fast signal sampling response for storing a value of the electrical signal and the second sampling circuit having a stable signal holding response for sampling the stored value from the first sampling circuit, the sampling circuits cooperating to generate samples of the electrical signal; and
   a cable driver circuit for transmitting the samples from the second sampling circuit through the cable to the oscilloscope.

9. The apparatus of claim 8 in which the sampling circuits comprise differentially connected sampling bridges.

10. The apparatus of claim 8 further including a buffer amplifier that provides a DC offset to the electrical signal, the DC offset being responsive to an offset signal transmitted from the oscilloscope through the cable to the buffer amplifier.

11. The apparatus of claim 8 in which the sampling circuits cooperate with a sample timing circuit that is responsive to a strobe signal received from the oscilloscope through the cable.

12. In an oscilloscope system, a cable-end mounted apparatus for probing and sampling an electrical signal, comprising:
   a buffer amplifier having an input and an output for receiving the electrical signal and providing a compensated electrical signal, the buffer amplifier having a shunt feedback network coupled between the input and the output, an input for an offset signal coupled to the buffer amplifier input, and a compensation circuit for input stage current coupled to the buffer amplifier input;

a sample timing circuit responsive to a first strobe signal, the sample timing circuit generating a second strobe signal;

a first track-and-hold circuit coupled to the buffer amplifier and responsive to the first strobe signal for storing a value of the compensated electrical signal;

a second track-and-hold circuit coupled to the first track-and-hold circuit and responsive to the second strobe signal for sampling the stored value from the first track-and-hold circuit; and a cable for conveying to the oscilloscope the sampled value from the second track-and-hold circuit, the cable also conveying from the oscilloscope the offset signal for the buffer amplifier, the first strobe signal for the sample timing circuit, and a power source for the apparatus.

13. In an oscilloscope system, a cable-end mounted apparatus for sampling an electrical signal, comprising:

sample timing means responsive to a first strobe signal for generating a second strobe signal;

first sampling means coupled to the electrical signal and responsive to the first strobe signal for producing first samples;

second sampling means receiving the first samples and responsive to the second strobe signal for producing second samples; and cable means for conveying to the oscilloscope an output signal responsive to the second samples, the cable means also conveying from the oscilloscope the first strobe signal and a power source for the apparatus.

14. The apparatus of claim 13 in which the power source includes a potential no greater than 24 volts.

15. The apparatus of claim 13 in which either the first sampling means or the second sampling means include a diode bridge.

16. In an oscilloscope system, a cable-end mounted apparatus for probing and sampling an electrical signal, comprising:

buffer amplifier means having an input and an output for receiving the electrical signal and providing a compensated electrical signal, the buffer amplifier means having a shunt feedback network coupled between the input and the output, an input for a signal conditioning signal coupled to the buffer amplifier means input, and a compensation circuit for input stage current coupled to the buffer amplifier means input;

signal sampling means coupled to the buffer amplifier means to sample the compensated electrical signal; and cable means for conveying to the oscilloscope the sampled compensated electrical signal from the signal sampling means and for conveying from the oscilloscope the signal conditioning signal for the buffer amplifier means.

17. The apparatus of claim 16 in which the buffer amplifier includes a FET input stage.

18. The apparatus of claim 16 in which the cable means further conveys a less than ten volt source of power from the oscilloscope to the cable-end mounted apparatus.

19. The apparatus of claim 16 in which the signal sampling means includes a diode bridge.

* * * * *